United States Patent
Wu et al.

(10) Patent No.: US 10,847,712 B2
(45) Date of Patent: Nov. 24, 2020

(54) MAGNETORESISTOR DEVICES AND METHODS FOR FORMING THE SAME

(71) Applicant: Vanguard International Semiconductor Corporation, Hsinchu (TW)

(72) Inventors: Chien-Hsun Wu, Hsinchu (TW); Chien-Hui Li, Yilan (TW); Chih-Jen Hsiao, Jhuangwei Township (TW); Yung-Hsiang Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/263,685

(22) Filed: Jan. 31, 2019

(65) Prior Publication Data
US 2020/0044146 A1 Feb. 6, 2020

(30) Foreign Application Priority Data

Aug. 2, 2018 (TW) .............................. 107126878 A

(51) Int. Cl.
| | | |
|---|---|---|
| H01L 43/12 | (2006.01) | |
| G01R 33/09 | (2006.01) | |
| H01L 43/10 | (2006.01) | |
| H01L 43/08 | (2006.01) | |

(52) U.S. Cl.
CPC ............ *H01L 43/12* (2013.01); *G01R 33/093* (2013.01); *G01R 33/096* (2013.01); *H01L 43/08* (2013.01); *H01L 43/10* (2013.01)

(58) Field of Classification Search
CPC ......... H01L 43/12; H01L 43/08; H01L 43/10; G01R 33/093; G01R 33/096
See application file for complete search history.

(56) References Cited

U.S. PATENT DOCUMENTS

| | | | | |
|---|---|---|---|---|
| 10,008,662 | B2* | 6/2018 | You | H01L 43/12 |
| 2001/0040777 | A1* | 11/2001 | Watanabe | B82Y 25/00 |
| | | | | 360/321 |
| 2006/0209471 | A1* | 9/2006 | Nagasaka | H01F 10/30 |
| | | | | 360/324.1 |
| 2012/0043654 | A1* | 2/2012 | Lu | H01L 24/13 |
| | | | | 257/737 |
| 2013/0113478 | A1* | 5/2013 | Pant | G01R 33/02 |
| | | | | 324/252 |

(Continued)

OTHER PUBLICATIONS

JP 2009-123818, Konno. Machine translation attached. (Year: 2009).*

*Primary Examiner* — Kyung S Lee
(74) *Attorney, Agent, or Firm* — Birch, Stewart, Kolasch & Birch LLP

(57) ABSTRACT

A magnetoresistor device includes a magnetoresistor, a protection layer, a first conductive structure, and a second conductive structure. The magnetoresistor is disposed over a substrate. The protection layer is formed over a portion of the magnetoresistor. The first conductive structure is disposed over the protection layer and includes a lower barrier layer and a metal layer disposed over the lower barrier layer. The second conductive structure is disposed over the substrate and partially covers the magnetoresistor. The second conductive structure includes the lower barrier layer and the metal layer disposed over the lower barrier layer.

17 Claims, 12 Drawing Sheets

(56) References Cited

U.S. PATENT DOCUMENTS

| | | | |
|---|---|---|---|
| 2014/0175580 A1* | 6/2014 | Chen | H01L 43/08 257/421 |
| 2015/0340594 A1* | 11/2015 | Liou | H01L 43/12 257/48 |
| 2017/0170387 A1* | 6/2017 | Kim | G11C 11/161 |
| 2018/0159026 A1* | 6/2018 | Shiokawa | H01L 27/1222 |
| 2018/0269380 A1* | 9/2018 | Li | H01L 28/24 |

* cited by examiner

MAGNETORESISTOR DEVICES AND METHODS FOR FORMING THE SAME

CROSS REFERENCE TO RELATED APPLICATION

This application claims the benefit of Taiwan Patent Application No. 107126878 filed on Aug. 2, 2018, entitled "MAGNETORESISTOR DEVICES AND METHODS FOR FORMING THE SAME" which is hereby incorporated herein by reference.

BACKGROUND

Technical Field

The disclosure relates to magnetoresistor devices, and more particularly, to conductive structures in magnetoresistor devices and methods for forming the same.

Description of the Related Art

In recent years, magnetoresistor devices have been widely used in various electronic products, for example, personal computers, mobile phones, and digital cameras. Magnetoresistor devices include magnetoresistors formed by magnetoresistive materials, and the magnetic moment orientations of the magnetoresistors can vary based on applied magnetic fields thereby changing the resistance of the magnetoresistors. Common magnetoresistors include the anisotropic magnetoresistor (AMR), the giant magnetoresistor (GMR), and the tunneling magnetoresistor (TMR). For example, the magnetic moment orientation of a magnetoresistor is generally parallel to its length direction; the anisotropic magnetoresistor (AMR) has a maximum resistance when the magnetic moment orientation of the magnetoresistor is parallel to the direction of the current flowing through the magnetoresistor; the magnetoresistor has a minimum resistance when the magnetic moment orientation of the magnetoresistor is perpendicular to the direction of the current flowing through the magnetoresistor.

For example, a magnetoresistor device including an AMR is generally in electrical connection with wires of conductive structures which are formed on the AMR. For applications that sense direction and the value of magnetic fields, the conductive structures are formed on an AMR with a barber pole (BBP)-like pattern. One ideal design is to design it so that the direction of the current flowing through the AMR between the BBP conductive structures has the shortest distance between the BBP conductive structures. One common design has the length direction of the BBP conductive structure intersect the length direction of the AMR at an angle of 45 degrees so that the resistance of the AMR has the best linear response to the applied magnetic field.

In the existing manufacturing process of magnetoresistor devices, the process for forming conductive structures still face various new challenges, particularly in reducing the damage to the magnetoresistor, and thus methods for forming magnetoresistor devices still need further improvements.

SUMMARY

Some embodiments of the present disclosure provide a magnetoresistor device. The magnetoresistor device includes a magnetoresistor, a protection layer, a first conductive structure, and a second conductive structure. The magnetoresistor is disposed over a substrate. The protection layer is formed over a portion of the magnetoresistor. The first conductive structure is disposed over the protection layer and includes a lower barrier layer and a metal layer disposed over the lower barrier layer. The second conductive structure is disposed over the substrate and partially covers the magnetoresistor. The second conductive structure includes the lower barrier layer and the metal layer disposed over the lower barrier layer.

Some embodiments of the present disclosure provide a method for forming a magnetoresistor device. The method includes sequentially forming a magnetoresistive material layer and a protection material layer over a substrate, performing a first patterning process on the protection material layer and the magnetoresistive material layer to form a protection layer and a magnetoresistor respectively, sequentially forming a first barrier material layer and a metal material layer over the substrate to cover the protection layer and the magnetoresistor, performing a second patterning process on the metal material layer and the first barrier material layer to form a metal layer and a lower barrier layer of a first conductive structure respectively, and performing a wet etching process on the protection layer to remove portions of the protection layer uncovered by the first conductive structure. The protection layer protects the underlying magnetoresistor during the second patterning process.

In order to make features and advantages of the present disclosure easy to understand, a detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1B:
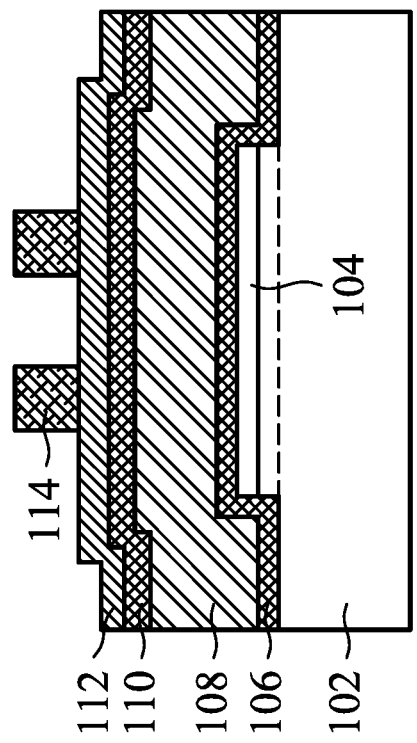
FIGS. 1A-1D illustrate cross-sectional views of forming a magnetoresistor device at intermediate stages in accordance with some examples.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1A:
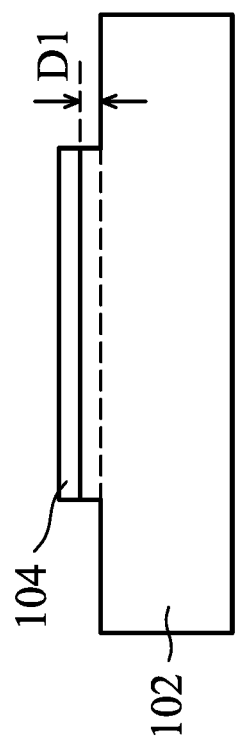
Figure 1C:
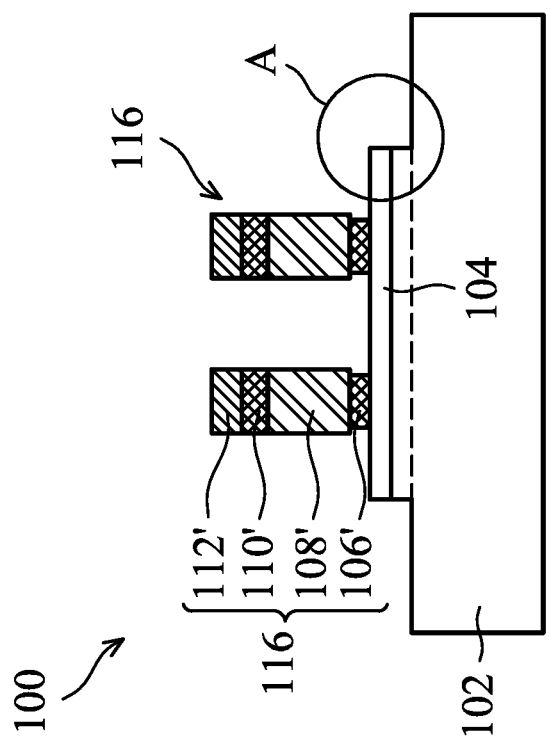
Figure 1D:
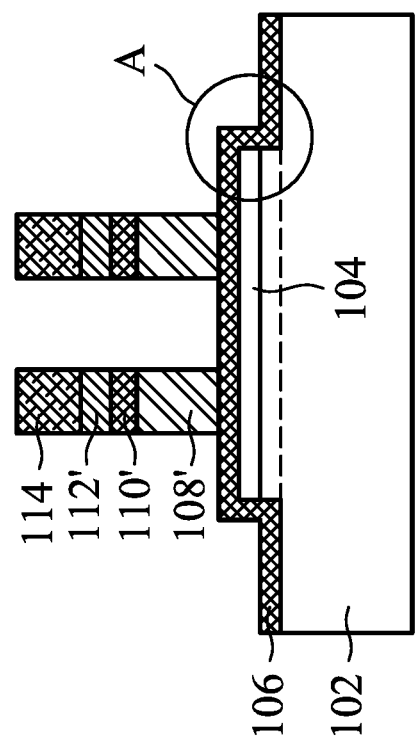

FIGS. 1A-1D illustrate cross-sectional views of forming a magnetoresistor device 100 shown in FIG. 1D at intermediate stages in accordance with some examples. Referring to FIG. 1D, the magnetoresistor device 100 includes a substrate 102, magnetoresistor 104, and patterned conductive structures 116. In the examples, the substrate 102 may include an active element (not shown) disposed therein, an inter-metal dielectric layer (IMD) layer (not shown) formed in an upper portion of the substrate 102 and over the active element. The active element is in electrical connection with the patterned conductive structures 116 and the magnetoresistor 104 through an interconnect structure. The magnetoresistor 104 is disposed over the IMD layer of the substrate 102. The patterned conductive structures 116 are disposed over portions of the magnetoresistor 104 and are configured to change the direction of a current flowing between the patterned conductive structures 116 so that the resistance of the magnetoresistor 104 has a linear response to an applied magnetic field. The patterned conductive structures 116 includes a lower barrier layer 106', a metal layer 108', upper barrier layer 110', and anti-reflective coating (ARC) layer 112' sequentially stacked over the magnetoresistor 104. The method for forming the magnetoresistor device 100 is detailed described below.

Referring to FIG. 1A, a substrate 102 is provided and a magnetoresistive material layer is formed over the substrate 102. In this example, the magnetoresistive material layer may be a stacked structure which includes nickel iron (NiFe), cobalt iron (CoFe), cobalt iron boron (CoFeB), platinum manganese (PtMn), ruthenium (Ru), lanthanum manganese (IrMn), copper (Cu), tantalum (Ta), or the like.

Next, a patterning process is performed on the magnetoresistive material layer to form a patterned magnetoresistor 104, such as an anisotropic magnetoresistor (AMR) or a giant magnetoresistor (GMR). In this example, the patterning process includes forming a patterned photoresist layer (not shown) over the magnetoresistive material layer, performing a dry etching process on the magnetoresistive material layer to remove portions of the magnetoresistive material layer uncovered by the patterned photoresist, and removing the patterned photoresist layer. In order to remove the portions of the magnetoresistive material layer uncovered by the patterned photoresist completely, the dry etching process generally over-etches the IMD layer of the substrate 102 to a depth D1, such as in a range from about 500 Å to about 1000, to form a height difference.

Referring to FIG. 1B, a first barrier material layer 106, a metal material layer 108, a second barrier material layer 110, and an ARC layer 112 are sequentially formed over the substrate 102 and covers the magnetoresistor 104. In this example, the material of the first barrier material layer 106 may include titanium tungsten (TiW), titanium nitride (TiN) or titanium (Ti). The material of the metal material layer 108 may include AlCu alloy. The material of the second barrier material layer 110 includes TiN.

Referring to FIG. 1B, a patterning process is performed on the ARC layer 112, the second barrier material layer 110, and the metal material layer 108. The patterning process includes forming a patterned photoresist layer 114 over the ARC layer 112.

The patterning process also includes performing a dry etching process on the ARC layer 112 together with the second barrier material layer 110 and the metal material layer 108 to remove portions of the ARC layer 112, the second barrier material layer 110 and the metal material layer 108 uncovered by the patterned photoresist layer 114. In the dry etching process, an etching rate to the first barrier material layer 106 is lower than an etching rate to the metal material layer 108, and thus the first barrier material layer 106 is used as an etching stop layer for etching the metal material layer 108 to protect the underlying magnetoresistor 104 from etching damage. Referring to FIG. 1C, after the dry etching process, a patterned ARC layer 112', a patterned upper barrier layer 110', a patterned metal layer 108' are formed. The patterning process also includes removing the patterned photoresist layer 114 by an ashing process.

In order to prevent the magnetoresistor 104 from damage, a wet etching process is then used to remove portions of the first barrier material layer 106 uncovered by the ARC layer 112', the upper barrier layer 110', the metal layer 108' to form a patterned lower barrier layer 106'. After forming the lower barrier layer 106', the conductive structures 116 are formed, as shown in FIG. 1D.

It should be noted that the dry etching process performed on the magnetoresistor 104 typically over-etches the IMD layer of the substrate 102 to the depth D1 to form a height difference. An adhesive force between the first barrier material layer 106 and the magnetoresistor 104 is greater than an adhesive force between the magnetoresistor 104 and the IMD layer of the substrate 102. Thus, in the ashing process for the patterned photoresist layer 114, a deformation stress generated from the first barrier material layer 106 due to high temperature is prone to release the stress from the height difference of an edge of the pattern of the magnetoresistor 104 in a way of a local cracking so that the edge of the pattern of the magnetoresistor 104 is adhered by the local-cracked first barrier material layer 106 and is separated from the ILD of the substrate 102. When the following wet etching process removes the portions of the first barrier material layer 106, the edge of the pattern of the magnetoresistor 104 is locally peeled off, such as in a region A shown in FIG. 1D, thereby reducing the manufacturing yield of the magnetoresistor device 100 and increasing the risk of deteriorating the reliability of the magnetoresistor device 100.

Figure 2A:
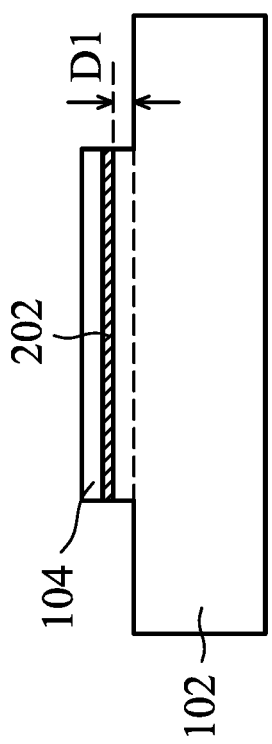
FIGS. 2A and 2B illustrate cross-sectional views of forming a magnetoresistor device at intermediate stages in accordance with some other examples.
Figure 2B:
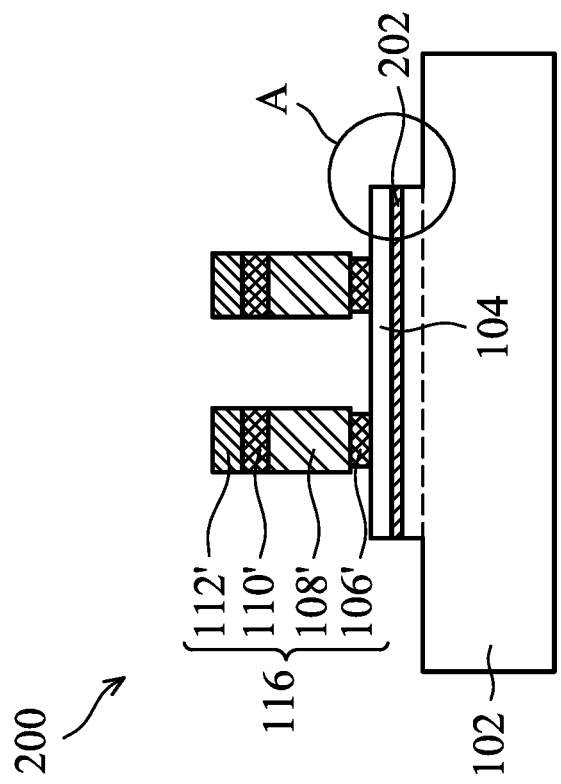

Referring to FIGS. 2A and 2B, which illustrate cross-sectional views of forming a magnetoresistor device 200 shown in FIG. 2B at intermediate stages in accordance with some examples of the present disclosure. Elements or layers in FIGS. 2A and 2B that are the same or similar to those in FIGS. 1A-1D are denoted by like reference numerals that have the same meaning, and the description thereof will not be repeated for the sake of brevity. The difference between the examples shown in FIGS. 2A and 2B and FIGS. 1A-1D is that the magnetoresistor device 200 in FIGS. 2A and 2B also includes a tantalum (Ta) adhesion layer 202 disposed between the magnetoresistor 104 and the IMD layer of the substrate 102. In the examples of FIGS. 2A and 2B, the Ta adhesion layer 202 is padded between the ILD layer of the substrate 102 and the magnetoresistive material layer thereby increasing an adhesive force between the magnetoresistor 104 and the ILD layer of the substrate 102, which solves the peeling problem of the magnetoresistor 104 described above.

Referring to FIG. 2A, an adhesion material layer, such as Ta, is formed over the ILD layer of the substrate 102, and then the magnetoresistive material layer is formed over the adhesion material layer. A patterning process is formed on the magnetoresistive material layer and the adhesion material layer to form a patterned magnetoresistor 104 and a patterned adhesion layer 202. Next, the steps of the process which are the same as or similar to those described above in FIGS. 1A-1D are performed to form the magnetoresistor device 200 shown in FIG. 2B.

Since the adhesion layer 202 can enhance the adhesive force between the magnetoresistor 104 and the ILD layer of the substrate 102, the adhesion layer 202 can inhibit that the first barrier material layer 106 is peeled off from the height difference of an edge of the pattern of the magnetoresistor 104 in a way of a local cracking, although the ashing process described above is performed on the patterned photoresist layer. Thus, when the following wet etching process removes the portions of the first barrier material layer 106, the local peeling from the edge of the pattern of the first barrier layer 106 such as in a region A shown in FIG. 2B is prevented, which solves the local-peeling problem of the magnetoresistor 104 described above in FIG. 1D.

In this example in which the adhesion layer is Ta, in order to prevent Ta atoms of the adhesion layer 202 from diffusing into the magnetoresistor 104 that causes the magnetoresistance ratio (MR %) is decreased, the process temperature after the formations of the adhesion layer 202 and the magnetoresistor 104 is limited to below 300° C. In the examples shown in FIGS. 1A-1D, the process temperature of chemical vapor deposition (CVD) for forming the ARC layer 112 ranges from about 300° C. to about 400° C., while in the example shown in FIGS. 2A and 2B, the process temperature of CVD for forming the ARC layer 112 ranges from about 250° C. to about 300° C. The CVD performed at a low temperature has a lower deposition rate and poor thickness uniformity and more undesirable particle performance, which reduce the manufacturing efficiency and production yield of the magnetoresistor device 200. Furthermore, limiting the process temperature to below 300° C. causes the magnetoresistor 104 to fail to perform a subsequent high-temperature annealing process to enhance MR %.

Figure 3A:
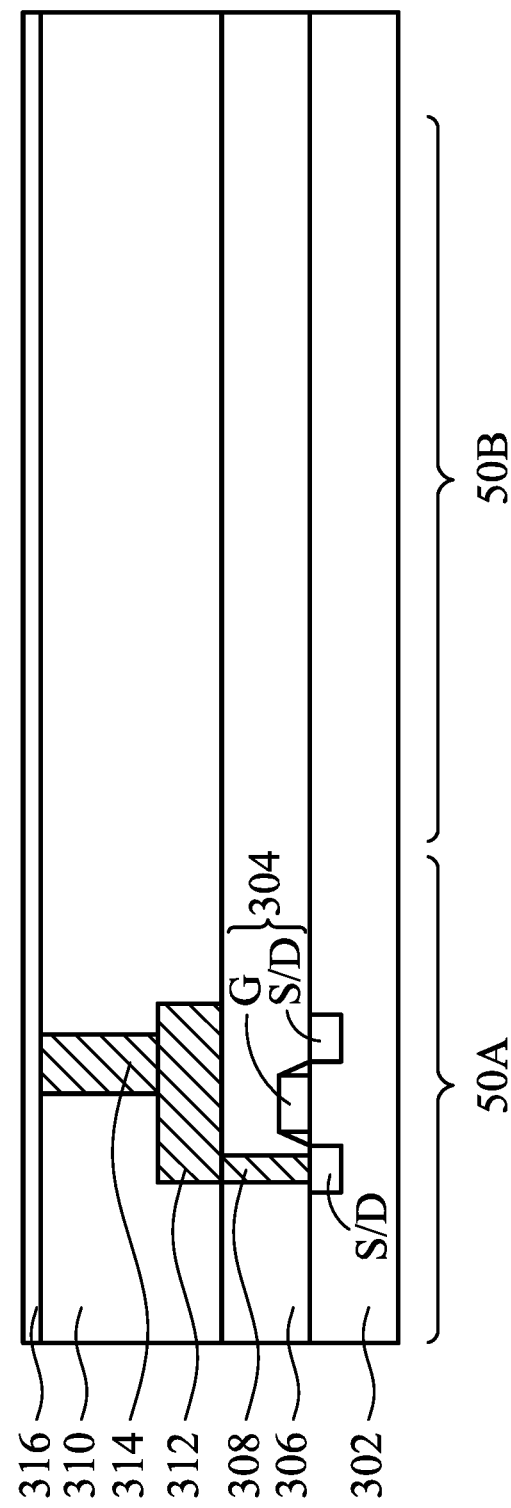
FIGS. 3A-3I illustrate cross-sectional views of forming a magnetoresistor device at intermediate stages in accordance with some embodiments of the present disclosure.
Figure 3B:
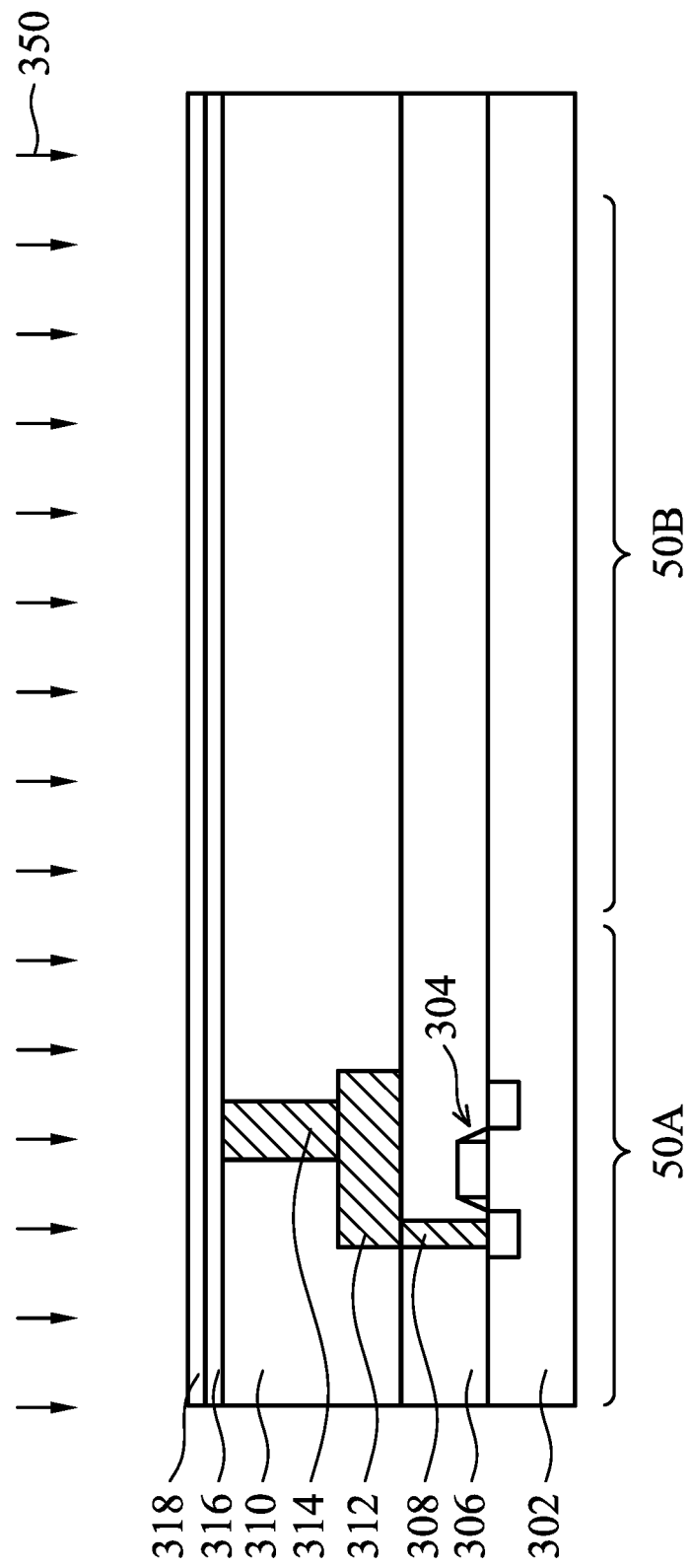
Figure 3C:
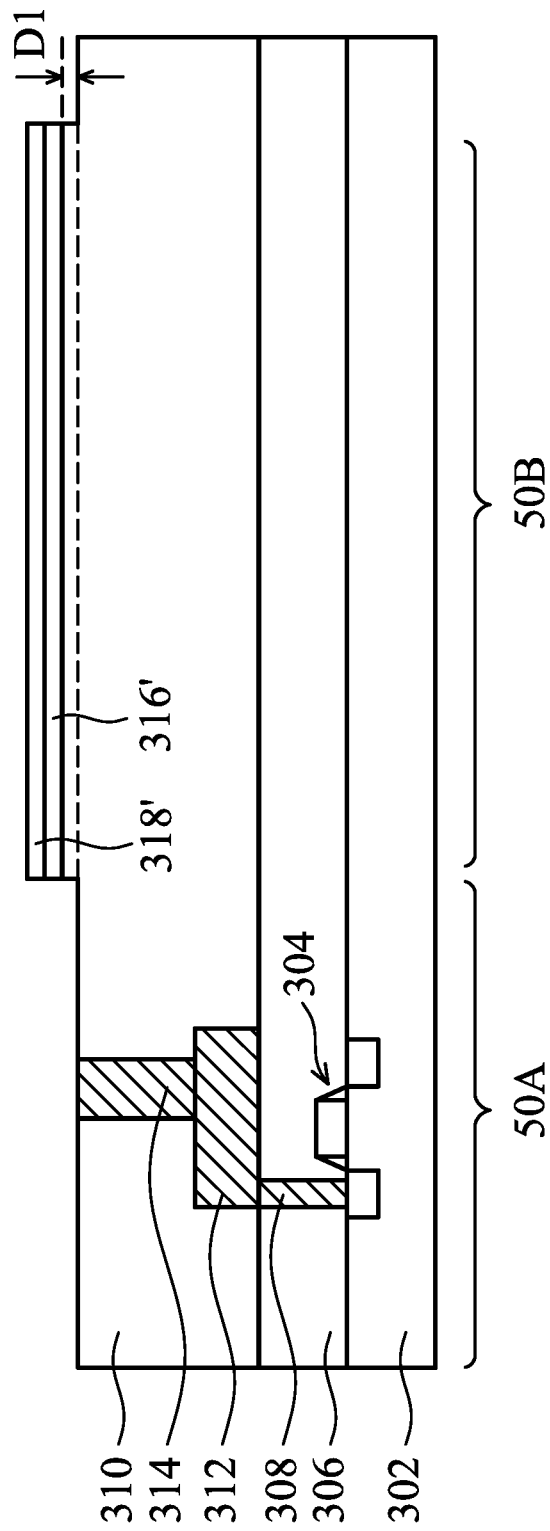
Figure 3D:
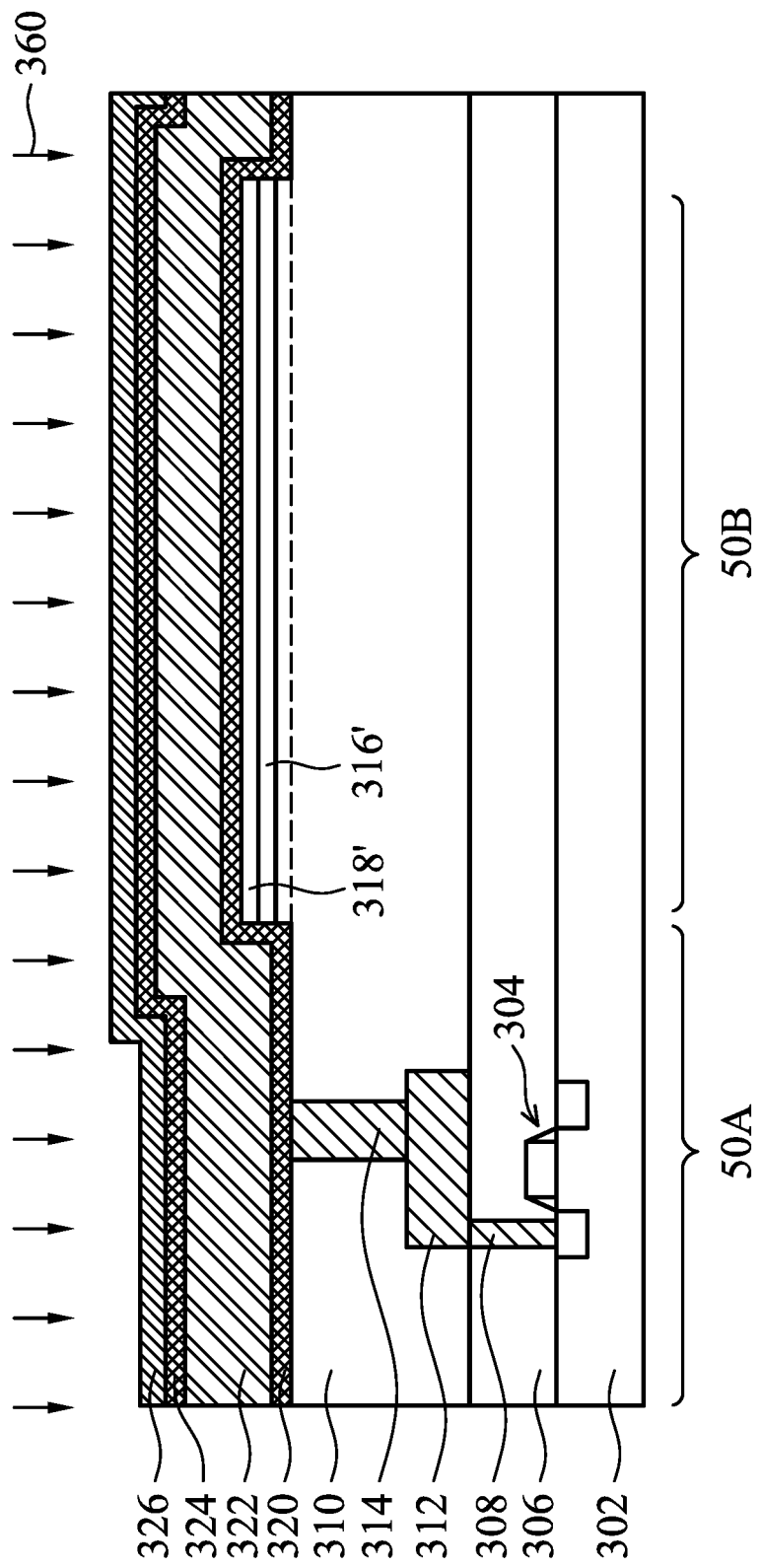
Figure 3E:
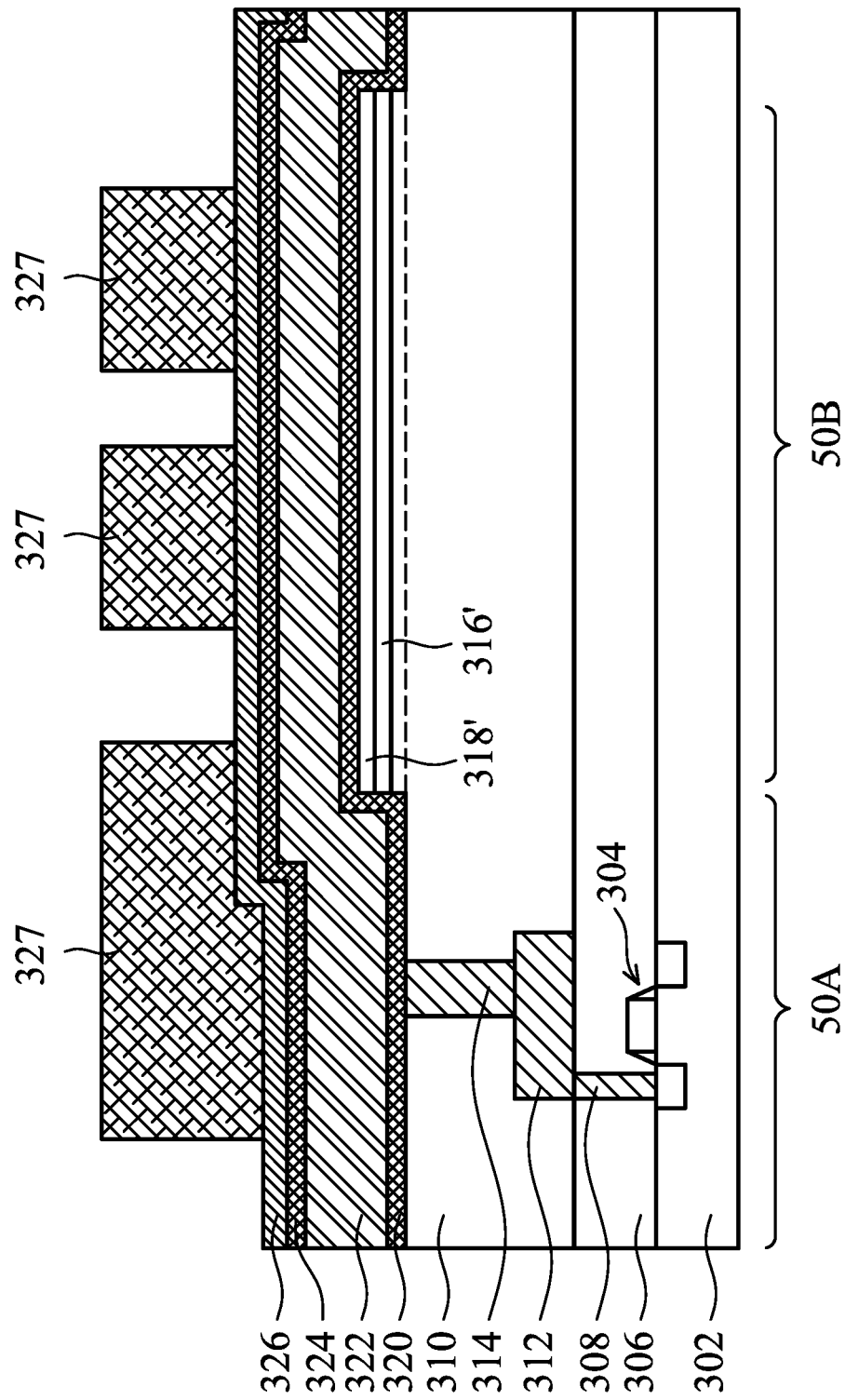
Figure 3F:
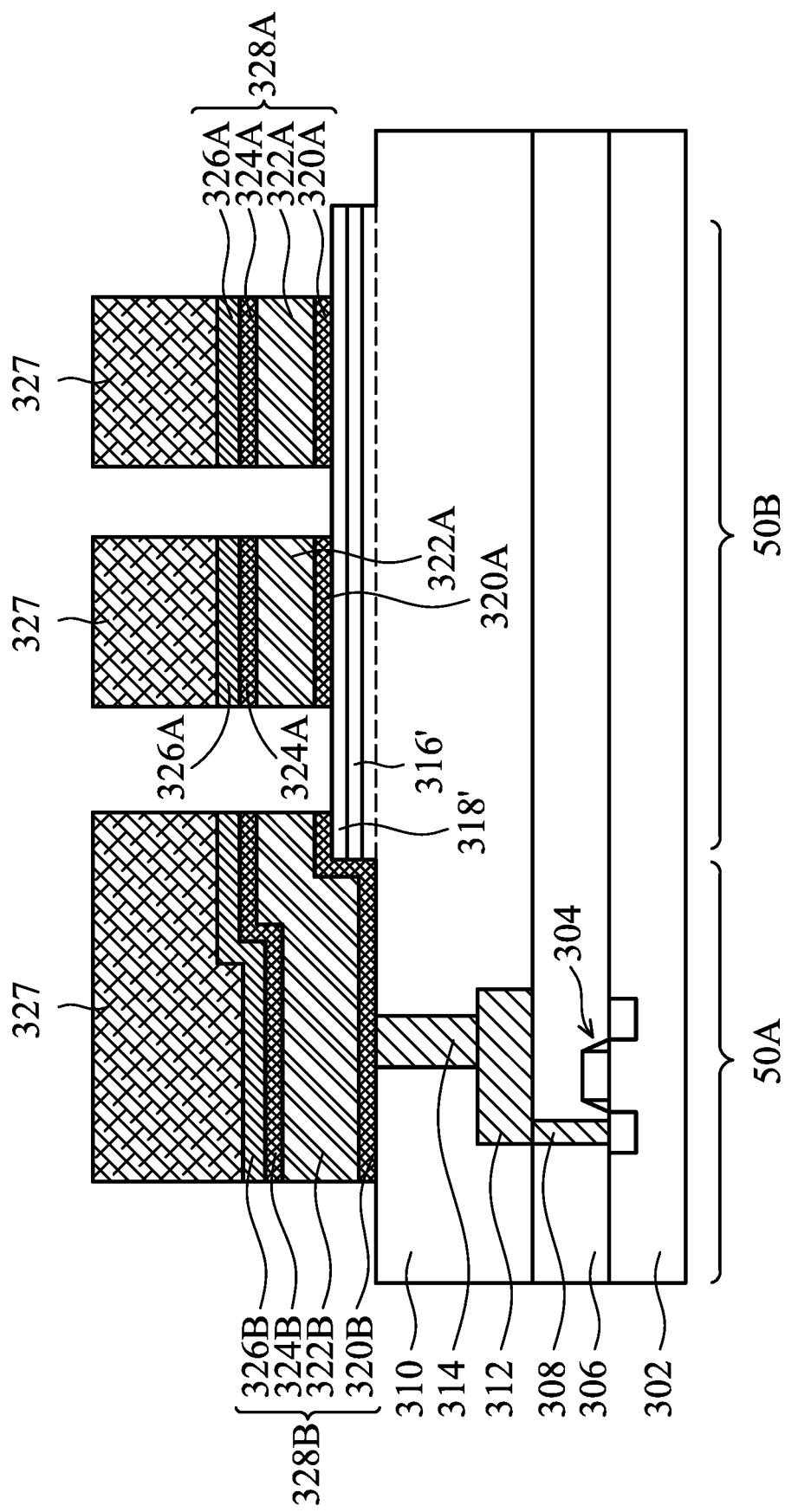
Figure 3G:
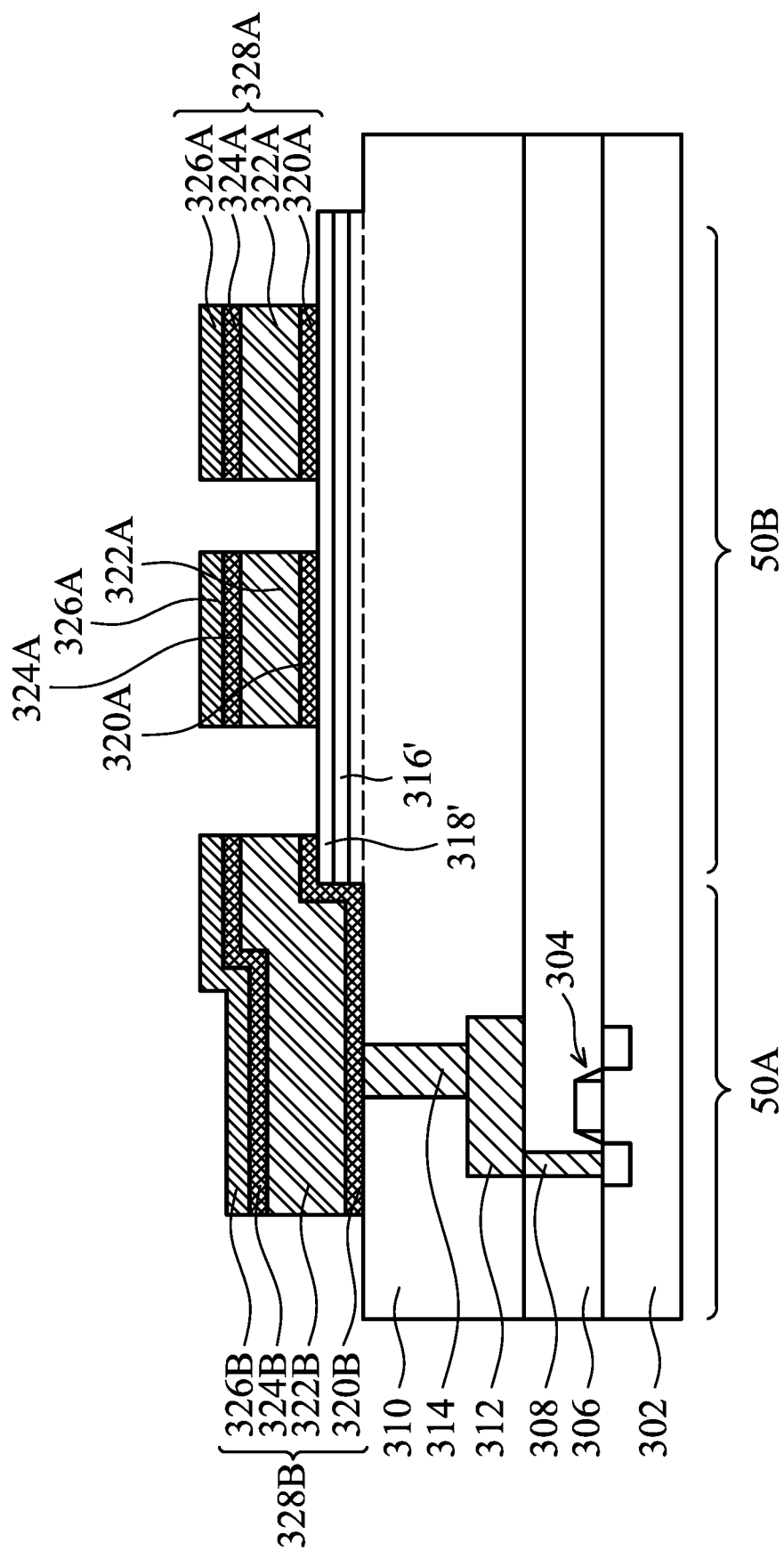
Figure 3H:
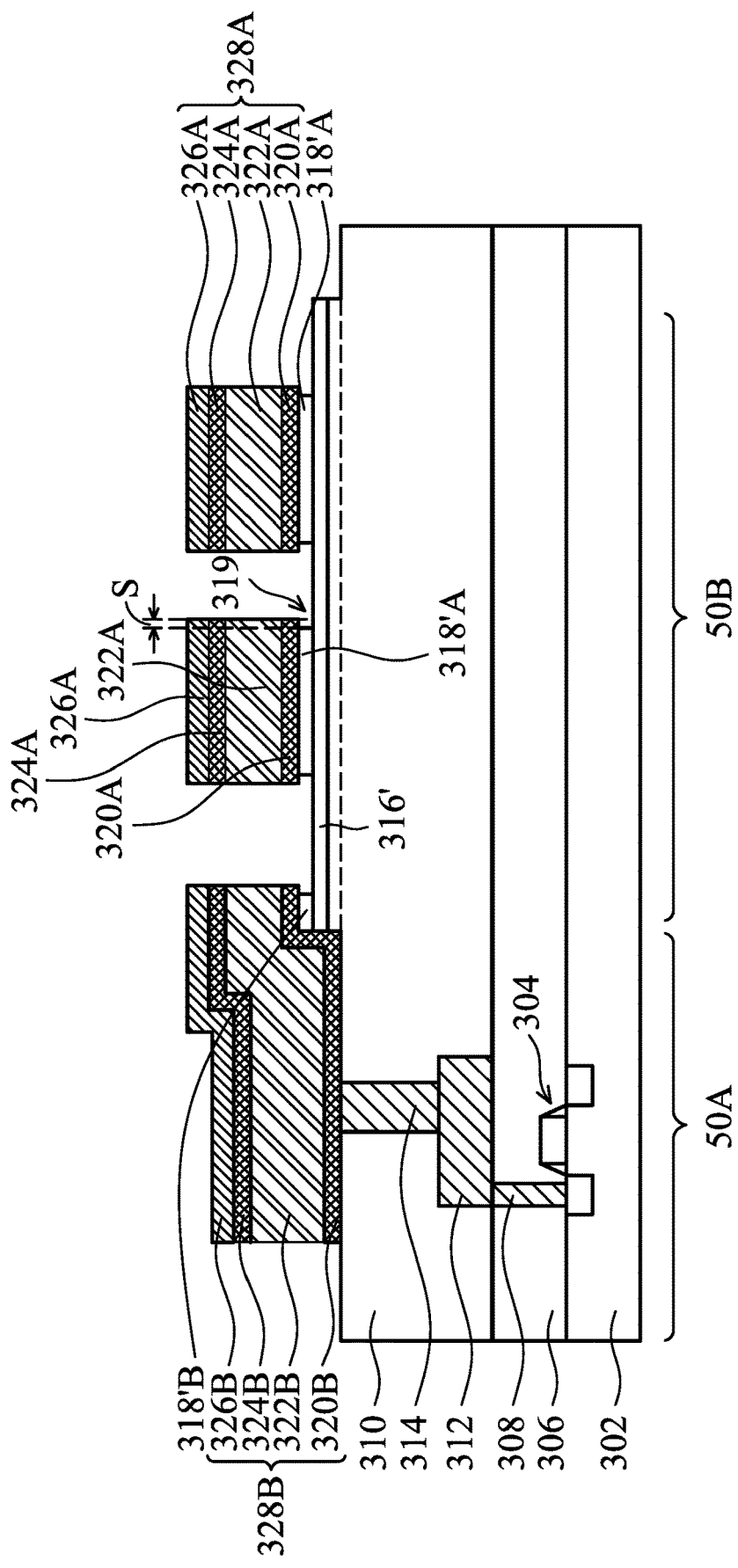
Figure 3I:
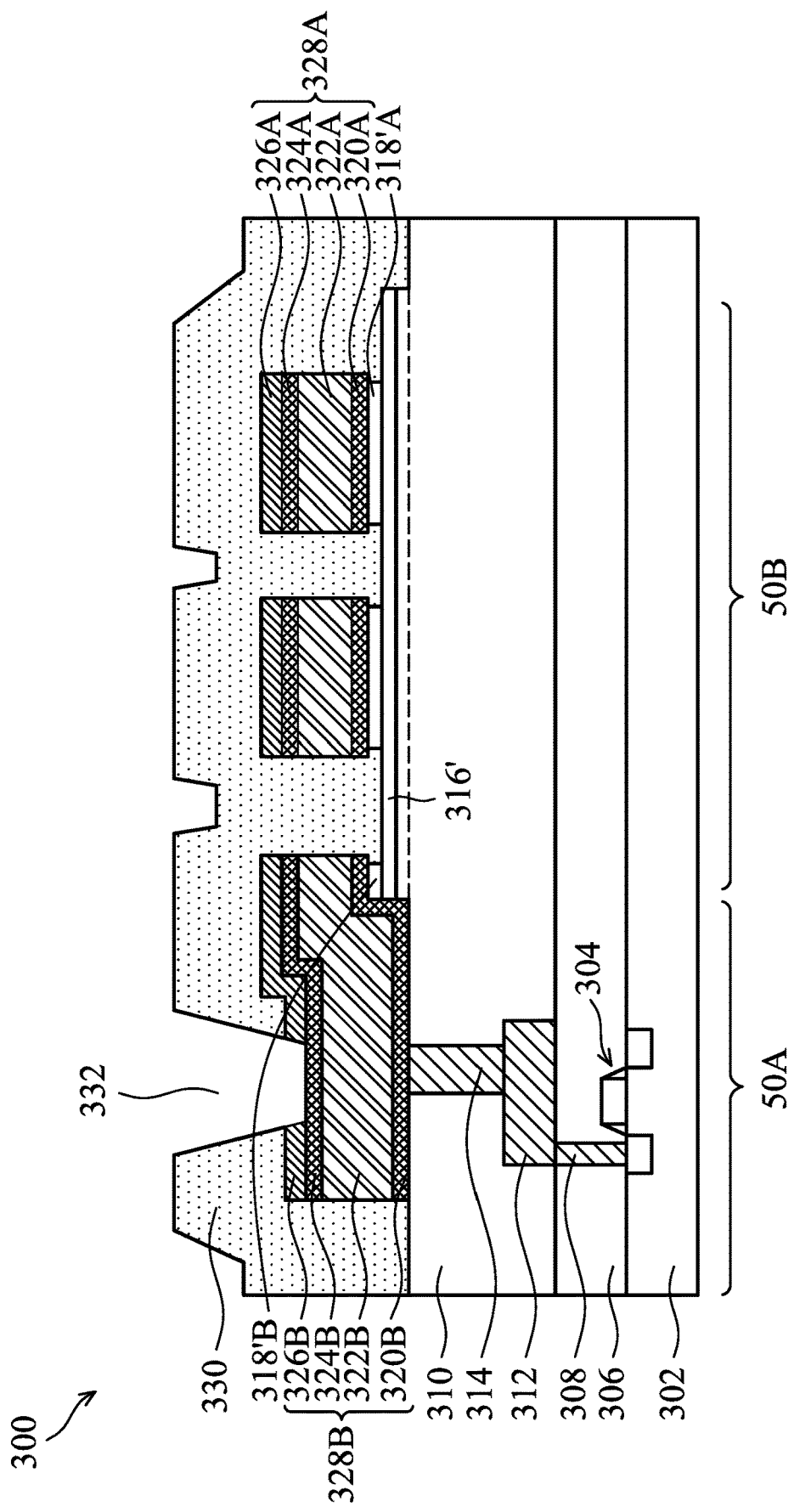

FIGS. 3A-3I illustrate cross-sectional views of forming a magnetoresistor device 300 shown in FIG. 3I at intermediate stages in accordance with some embodiments of the present disclosure. According to the embodiments shown in FIGS. 3A-3I, a protection layer is formed over the magnetoresistive material layer before a patterning process for the magnetoresistive material layer and then the magnetoresistive material layer together with the protection layer is patterned. As such, the embodiments shown in FIGS. 3A-3I prevent the problem of the deformation stress to the first barrier material layer due to the height difference formed by etching the magnetoresistive material layer and solve the peeling problem as described above in FIGS. 1A-1D without forming an adhesion material layer between a magnetoresistive material layer and an IMD layer.

Referring to FIG. 3A, a substrate 302 is provided. The substrate 302 may be any substrate which is used to form magnetoresistor device thereon. In some embodiments, the substrate 302 may be a silicon substrate, a silicon germanium (SiGe) substrate, a bulk semiconductor substrate, a compound semiconductor substrate, a silicon-on-insulator (SOI) substrate, or the like.

In some embodiments, the substrate 302 includes a device region 50A and a sensing region 50B. An active element 304 is formed in the device region 50A of the substrate 302. In an embodiment, the active element 304 may be a transistor, a diode or the like. For example, the active element 304 may be a field effect transistor (FET) which includes a gate structure G and a source/drain region S/D.

Next, an interconnect structure is formed over the substrate 302. The interconnect structure includes an interlayer dielectric (ILD) layer 306, a contact 308, an inter-metal dielectric (IMD) layer 310, a metal line 312, and a via 314.

The ILD layer 306 is formed over the substrate 302 and covers the active element 304. In some embodiments, the material of the ILD layer 306 may include or be phosphosilicate glass (PSG), borophosphosilicate glass (BPSG), undoped silicate glass (USG), fluorinated silica glass (FSG), the like, multilayers thereof, or a combination thereof. The ILD layer 306 may be formed by CVD, such as plasma-enhanced CVD (PECVD).

The contact 308 penetrates through the ILD layer 306 to electrically connect the active element 304. Although FIG. 3A illustrates the contact 308 in connection with the source/drain region S/D of the active element 304, the contact 308 may be in connection with the gate structure G of the active element 304 in some other embodiments. In some embodiments, the material of the contact 308 may include or be conductive materials, such as tungsten (W), nickel (Ni), titanium (Ti), tantalum (Ta), aluminum (Al), copper (Cu), titanium nitride (TiN), tantalum nitride (TaN), the like, multilayer thereof, or a combination thereof. The contact 308 may be formed by an etching process and a deposition process. The deposition process may include CVD, atomic layer deposition (ALD) or physical vapor deposition (PVD). Physical vapor deposition may be sputtering or pulsed laser deposition (PLD).

The IMD layer 310 is formed over the ILD layer 306. In some embodiments, the material of the IMD layer 310 may include or be silicon oxide, silicon nitride, silicon oxynitride, silicon carbide, silicon carbon nitride, silicon carbon oxide, PSG, BPSG, USG, FSG, the like, multilayers thereof, or a combination thereof. The 1 MB layer 310 may be formed by CVD such as PECVD.

The metal line 312 and the via 314 are formed in the 1 MB layer 310 and in electrical connection with the contact 308. Although FIG. 3A illustrates that a single-layered 1 MB layer 310, and a metal line 312 and a via 314 are formed therein, multi-layered 1 MB layers 310 and, a metal line 312 and a vias 314 formed in each layer of the multi-layered 1 MB layers 310 may be formed in some other embodiments. In some embodiments, the materials of the metal line 312 and the via 314 may include or be conductive material, such as tungsten (W), nickel (Ni), titanium (Ti), tantalum (Ta), aluminum (Al), copper (Cu), titanium nitride (TiN), tantalum nitride (TaN), the like, multilayer thereof, or a combination thereof. The metal line 312 and the via 314 may be formed by a single damascene process or a dual damascene process.

Still referring to FIG. 3A, a magnetoresistive material layer 316 is formed over the IMD layer 310. In some embodiments, no tantalum-containing adhesion layer is formed between the ILD layer 310 and the magnetoresistive material layer 316. In some embodiments, the magnetoresistive material layer 316 may include or be nickel iron (NiFe), cobalt iron (CoFe), cobalt iron boron (CoFeB), Copper (Cu), platinum manganese (PtMn), iridium manganese (IrMn), ruthenium (Ru), the like, multilayers thereof, a combination thereof, or other materials suitable for constituting an AMR or GMR stacked structure. The magnetoresistive material layer 316 may be formed over the ILD layer 310 by CVD, PVD, ALD, the like, or a combination thereof.

Referring to FIG. 3B, a protection material layer 318 is formed over the magnetoresistive material layer 316. In some embodiments, the protection material layer 318 has a thickness in a range from about 300 Å to about 1500 Å. In some embodiments, the material of the protection material layer 318 may include or be titanium tungsten (TiW), titanium (Ti), titanium nitride (TiN), the like, or a combination thereof. The protection material layer 318 may be formed by PVD, ALD, the like, or a combination thereof. The PVD may be sputtering or PLD. In an embodiment, the protection material layer 318 includes TiW with a weight ratio of Ti to W about 1:9.

Next, a first patterning process 350 is performed on the protection material layer 318 and the magnetoresistive material layer 316. Referring to FIG. 3C, after the first patterning process 350, the protection material layer 318 and the magnetoresistive material layer 316 respectively form a patterned protection layer 318' and a patterned magnetoresistor 316' in the sensing region 50B of the substrate 302.

In some embodiments, the steps of the first patterning process 350 include forming a patterned mask layer (not shown) such as a patterned photoresist layer or a patterned hard mask layer over the protection material layer 318, performing a dry etching process on the protection material layer 318 together with the magnetoresistive material layer 316, removing portions of the protection material layer 318 and the magnetoresistive material layer 316 uncovered by patterned mask layer to form the protection layer 318' and the magnetoresistor 316', and then removing the patterned mask layer over the protection layer 318' such as by ashing process or wet strip process. In some embodiments in which the patterned mask layer is a patterned photoresist layer, the dry etching process and the ashing process may be in-situ performed in an etching equipment. In some embodiments, the dry etching process of the first patterning process 350 may be reactive ion etch (RIE), electron cyclotron resonance (ERC), inductively-coupled plasma (ICP), ion beam etch (IBE), the like, or a combination thereof.

In some embodiments, in order to completely remove the portions of the protection material layer 318 and the magnetoresistive material layer 316 uncovered by the patterned mask layer, the dry etching process over-etches the IMD layer 310 to a depth D1, as shown in FIG. 3C.

Referring to FIG. 3D, a first barrier material layer 320 is formed over the IMD layer 310 to cover the protection layer 318' and magnetoresistor 316'. The first barrier material layer 320 is used to prevent W atoms from the material of the via 314 from diffusing into an overlying metal material layer 322 (such as AlCu alloy) subsequently formed. In some embodiments, the thickness of the first barrier material layer 320 may be in a range about 250 Å to about 750 Å. In some embodiments, the first barrier material layer 320 may include or be titanium nitride (TiN), titanium (Ti), tantalum nitride (TaN), tantalum (Ta), the like, or a combination thereof. The first barrier material layer 320 may be formed by PVD, ALD, the like, or a combination thereof. PVD may be sputtering or PLD.

Next, a metal material layer 322 is formed over the first barrier material layer 320. In some embodiments, the thickness of the metal material layer 322 may be in a range from about 3000 Å to about 8000 Å. In some embodiment, the metal material layer 322 may include or be AlCu, Al, AlSiCu, or the like and may be formed by PVD, ALD, electroplating, the like, or a combination thereof. PCVD may be sputtering or PLD.

Next, a second barrier material layer 324 may be formed over the metal material layer 322. The second barrier material layer 324 is used to prevent the metal material layer 322 from being oxidized. In some embodiments, the thickness of the second barrier material layer 324 may be in a range from about 500 Å to about 1000 Å. In some embodiments, the second barrier material layer 324 may include or be titanium nitride (TiN), titanium (Ti), tantalum nitride (TaN), tantalum (Ta), the like, or a combination thereof. The first barrier material layer 320 may be formed by CVD, PVD, ALD, the like, or a combination thereof. PVD may be sputtering or PLD. The material of the second barrier material layer 324 may be the same as or different from the material of the first barrier material layer 320.

Next, an anti-reflective coating (ARC) layer 326 is formed over the second barrier material layer 324. In some embodiments, the thickness of the ARC layer 326 may be in a range from about 250 Å to about 500 Å. In some embodiments, the material of the ARC layer 326 may include or be silicon oxide (SiO$_2$), silicon nitride (SiN), silicon oxynitride (SiON), silicon carbide (SiC), silicon carbon nitride (SiCN), silicon carbon oxide (SiOC), the like, or a combination thereof. The ARC layer 326 may be formed by CVD, such as PECVD.

Since the adhesion layer such as including Ta as described in FIGS. 2A-B is not used in the embodiments shown in FIG. 3D, CVD process for forming the ARC layer 326 may be performed at a high temperature such as in a range from about 300° C. to about 400° C. Forming the ARC layer 326 by high-temperature CVD process results in not only a higher deposition rate and a better thickness uniformity, but a lower undesirable particles performance, which enhances the manufacturing efficiency and production yield of the magnetoresistor device.

Next, a second patterning process 360 is performed on the ARC layer 326, the second barrier material layer 324, the metal material layer 322, and the first barrier material layer 320 to form a first conductive structure 328A and a second conductive structure 328B. The second patterning process 360 is detailed described below.

Referring to FIG. 3E, the steps of the second patterning process 360 include forming a patterned photoresist layer 327 over the ARC layer 326.

The steps of the second patterning process 360 also include performing a dry etching process on the ARC layer 326 together with the second barrier material layer 324, the metal material layer 322, and the first barrier material layer 320. In some embodiments, the dry etching process of the second patterning process 360 may be RIE, ERC, ICP, IBE, the like, or a combination thereof. During the dry etching process of the second patterning process 360, the protection layer 318' is used to protect the underlying magnetoresistor 316' from the damage of the dry etching.

In an embodiment, the protection layer 318' is TiW, the first and second barrier material layers 320 and 324 are TiN, the metal material layer 322 is AlCu alloy, and the ARC layer 326 is silicon nitride, for example. In this embodiment, the etching rate to TiW of the protection layer 318' is lower than the etching rate to TiN of the first barrier material layer 320, resulting in a high etching selectivity of TiW of the protection layer 318' to TiN of the first barrier material layer 320 ranging from about 4 to about 10. Thus, the dry etching process of the second patterning process 360 generally uses an endpoint mode to detect the completion of etching the metal material layer 322, and then uses a time mode to etch the first barrier material layer 320. Due to the high etching selectivity of TiW of the protection layer 318' to TiN of the first barrier material layer 320, the protection layer 318' protects the magnetoresistor 316' from damage of the dry etching.

In an embodiment, the protection layer 318' is TiN, the first and second barrier material layers 320 and 324 are TiN, the metal material layer 322 is AlCu alloy, and the ARC layer 326 is silicon nitride, for example. In this embodiment, since the etching rate to the protection layer 318' is the same as the etching rate to the first barrier material layer 320, TiN of the protection layer 318' may be formed with a thicker thickness, such as in a range of 2 to 3 times the thickness of the first barrier material layer 320, to assure that after the completion of etching the first barrier material layer 320, the protection layer 318' remains a sufficient thickness, thereby protecting the magnetoresistor 316' from damage of the dry etching.

Referring to FIG. 3F, after the dry etching process of the second patterning process 360, first conductive structures 328A are formed in sensing region 50B. The first conductive structures 328A include the patterned ARC layer 326A, the patterned upper barrier layer 324A, the patterned metal layer 322A and the patterned lower barrier layer 320A, which are disposed over portions the protection layer 318'.

Furthermore, after the dry etching process of the second patterning process 360, a second conductive structure 328B is formed in device region 50A. The second conductive structure 328B includes the patterned ARC layer 326B, the patterned upper barrier layer 324B, the patterned metal layer 322B and the patterned lower barrier layer 320B, which are disposed over the IMD layer 310. The via 314 in the IMD layer 310 is in contact with and in electrical connection with the lower barrier layer 320B. In addition, the second conductive structure 328B extends to the sensing region 50B and partially covers the protection layer 318' and the magnetoresistor 316' to electrically connect the magnetoresistor 316'.

After the dry etching process of the second patterning process 360, the protection layer 318' still completely covers the upper surface of the magnetoresistor 316', as shown in FIG. 3F.

The steps of the second patterning process 360 also includes removing the patterned photoresist layer 327, such as by an ashing process, as shown in FIG. 3G. In some embodiments, the ashing process and the dry etching process of the second patterning process 360 may be in-situ performed in a dry etching equipment.

It should be noted that the stress of the protection layer 318' to the magnetoresistor 316' is released after the etching process of the first patterning process 350, and the protection layer 318' is only formed over the protection layer 318' but does not extend to other regions, such as to covers the upper surface of the IMD layer 310. Furthermore, the stress of the conductive structures 328A and 328B to the protection layer 318' is released after conductive structures 328A and 328B are formed by the second patterning process 360. Therefore, the peeling problem as described in the embodiments shown in FIGS. 1A-1D where the protection layer 318' is cracked from the edge of the pattern of the magnetoresistor 316 to locally peel the edge of the pattern of the magnetoresistor 316', does not occur.

After the second patterning process 360, portions of the protection layer 318' over the magnetoresistor 316' and uncovered by the first conductive structure 318A and the second conductive structure 328B are then removed, and protection layers 318'A and 318'B (also referred to as remaining portions 318'A and 318'B) remain unremoved, as shown in FIG. 3H. In some embodiments, the removal may be performed by a wet etching process.

In some embodiments in which the protection layer 318' is TiW or TiN, the etchant of the wet etching process may use a hydrogen peroxide ($H_2O_2$)-containing solution, which prevents a damage to the magnetoresistor 316'. The protection layer 318' after the wet etching process forms a protection layers 318'A and 318'B. Since the wet etching process is isotropic, recesses 319 are formed with a lateral retraction S due to lateral etching.

Referring to FIG. 3I, a passivation layer 330 is formed over the IMD 310. The passivation layer 330 covers the first and second conductive structures 328A and 328B and the magnetoresistor 316'. In some embodiments, the material of the passivation layer 330 may include or be silicon oxide, silicon nitride, silicon oxynitride, the like, or a combination thereof. The passivation layer 330 may be formed by CVD such as PECVD. Afterward, the passivation layer 330 is etched to form an opening 332 to the second conductive structure 328B, and a magnetoresistor device 300 is provided.

In the embodiments of FIGS. 3A-3I, since no Ta adhesion layer is formed between the magnetoresistor 316' and the IMD layer 310, the CVD process for forming the passivation layer 330 may be performed at a high temperature, in a range from about 400° C. to about 450° C., for example. Forming the passivation layer 330 in a high-temperature CVD process results in not only a high deposition rate and a better thickness uniformity, but a lower undesirable particle performance, which enhances the manufacturing efficiency and production yield of the magnetoresistor device.

Furthermore, after the opening 332 is formed, a high-temperature anneal may be performed on the magnetoresistor device 300 to improve the performance of the magnetoresistor 316', such as by increasing the magnetoresistance ratio (MR %) and reducing the sheet resistance (Rsq). For example, the annealing temperature ranges from about 350° C. to about 450° C.

In the embodiments of the present disclosure, the magnetoresistor device 300 includes the IMD layer 310, the magnetoresistor 316', the protection layer 318'A, and the first conductive structure 328As, which are disposed over the substrate 302. The magnetoresistor 316' is formed in the sensing region 50B of the substrate 302 and over the 1 MB layer 310. The protection layer 318'A is formed over portions of the magnetoresistor 316'. The first conductive structure 328A is disposed over the protection layer 318'A. The first conductive structure 328A is used to change the current direction flowing through the magnetoresistor 316' between the neighboring first conductive structures 328A, resulting in magnetoresistance value is linear in response to the applied magnetic field. Although FIG. 3I shows two first conductive structures 328A formed over the magnetoresistor 316', the number of the first conductive structures 328A may be adjusted based on design demand and is not limited to the illustrated embodiments.

In some embodiments, the first conductive structures 328A include the lower barrier layer 320A, the metal layer 322A, the upper barrier layer 324A and the ARC layer 326A sequentially stacked over the protection layer 318'A.

In some embodiments, the magnetoresistor device 300 also includes the second conductive structure 328B which is laterally spaced apart from the first conductive structure 328A and disposed in the device region 50A of the substrate 302. The second conductive structure 328B is extended further into the sensing region 50B and covers the protection layer 318'B and an edge of the magnetoresistor 316'. The second conductive structure 328B is in electrical connection with the magnetoresistor 316'. The second conductive structure 328B includes the lower barrier layer 320B, the metal layer 322B, the upper barrier layer 324B and the ARC layer 326B sequentially stacked over the 1 MB layer 310. Furthermore, the via 314 in the 1 MB layer 310 is in contact with and in electrical connection with the lower barrier layer 320B of the second conductive structure 328B.

In some embodiments, the material of the via 314 is tungsten (W) and the material of the lower barrier layer 320B is TiN. TiN has a better ability to block W atoms than other materials, such as TiW. Thus, TiN of lower barrier layer 320B can preferably prevent W atoms from diffusing into the overlying metal layer 322B to enhance the reliability of the magnetoresistor device 300.

In summary, according to the embodiments of the present disclosure, the protection material layer is formed over the magnetoresistive material layer, and then the magnetoresistive material layer together with the protection material layer is patterned into the protection layer and the magnetoresistor. The protection layer is only formed over the magnetoresistor, but it does not extend to other regions, such as to cover the upper surface of the 1 MB layer. Thus, in the following processes, the protection layer would not be cracked formed an edge of the pattern of the magnetoresistor, resulting in preventing the problem of local peeling of the magnetoresistor from an edge of its pattern, which in turn enhances the production yield of the magnetoresistor device.

In addition, in some embodiments, since no Ta adhesion layer is formed between the magnetoresistor and the IMD layer, the process temperature would not be limited to below 300° C. CVD performed at a high temperature has not only a high deposition rate and a better thickness uniformity, but a lower undesirable particle performance, which enhances the manufacturing efficiency and the production yield of the magnetoresistor device. Furthermore, after the magnetoresistor device is formed, a high-temperature anneal may be performed on the magnetoresistor device to further enhance the performance of the magnetoresistor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistor device, comprising:
a magnetoresistor disposed over a substrate;
a protection layer formed over a portion of the magnetoresistor;
a first conductive structure disposed over the protection layer, wherein the first conductive structure comprises:
a lower barrier layer and a metal layer disposed over the lower barrier layer; and
a second conductive structure disposed over the substrate and partially covering the magnetoresistor, wherein the protection layer is disposed between the second conductive structure and the magnetoresistor, and the second conductive structure comprises:
the lower barrier layer and the metal layer disposed over the lower barrier layer.

2. The magnetoresistor device as claimed in claim 1, wherein a material of the protection layer includes TiW, Ti or TiN.

3. The magnetoresistor device as claimed in claim 1, wherein a material of the lower barrier layer includes TiN, Ti, TaN or Ta.

4. The magnetoresistor device as claimed in claim 1, further comprising:
an IMD layer disposed over the substrate, wherein the magnetoresistor and the second conductive structure are disposed over the IMD layer, and a via in the IMD layer is in electrical connection with the second conductive structure.

5. The magnetoresistor device as claimed in claim 1, wherein the first conductive structure further comprises:
an upper barrier layer and an anti-reflective coating (ARC) layer sequentially stacked over the metal layer of the first conductive structure.

6. The magnetoresistor device as claimed in claim 1, wherein the second conductive structure further comprises:
an upper barrier layer and an anti-reflective coating (ARC) layer sequentially disposed over the metal layer of the second conductive structure.

7. A method for forming the magnetoresistor device as set forth in claim 1, comprising:
sequentially forming a magnetoresistive material layer and a protection material layer over a substrate;
performing a first patterning process on the protection material layer and the magnetoresistive material layer to form a protection layer and a magnetoresistor respectively;
sequentially forming a first barrier material layer and a metal material layer over the substrate to cover the protection layer and the magnetoresistor;
performing a second patterning process on the metal material layer and the first barrier material layer to form a metal layer and a lower barrier layer of a first conductive structure respectively, wherein the protection layer protects the underlying magnetoresistor during the second patterning process; and
performing a wet etching process on the protection layer to remove portions of the protection layer uncovered by the first conductive structure.

8. The method as claimed in claim 7, wherein the first patterning process includes a dry etching process which etches the protection material layer together with the magnetoresistive material layer.

9. The method as claimed in claim 7, wherein the protection material layer includes TiW, Ti or TiN.

10. The method as claimed in claim 7, wherein the wet etching process uses an etchant that is a $H_2O_2$-containing solution.

11. The method as claimed in claim 7, wherein the first barrier material layer includes TiN, Ti, TaN or Ta.

12. The method as claimed in claim 7, wherein the metal material layer includes AlCu alloy, Al or AlCuSi alloy.

13. The method as claimed in claim 7, further comprising:
sequentially forming a second barrier material layer and an anti-reflective coating (ARC) layer over the metal material layer,
wherein the second barrier material layer includes TiW, Ti, TiN or Ta,
wherein the ARC layer includes SiN or SiON,
wherein the second patterning process is further performed on the second barrier material layer and the ARC layer to form an upper barrier layer and an ARC layer of the first conductive structure respectively.

14. The method as claimed in claim 7, further comprising:
forming an IMD layer over the substrate before the magnetoresistive material layer is formed, wherein the magnetoresistive material layer is formed over the IMD layer.

15. The method as claimed in claim 14, wherein after the second patterning process is performed, the metal material layer and the first barrier material layer further form the metal layer and the lower barrier layer of a second conductive structure over the IMD layer respectively,
wherein the second conductive structure has a portion that partially covers the protection layer.

16. The method as claimed in claim 15, wherein a portion of the protection layer that is covered by the second conductive structure remains unremoved after the wet etching process.

17. The method as claimed in claim 15, wherein a via in the IMD layer is in electrical connection with the lower barrier layer of the second conductive structure.

* * * * *